United States Patent
Leipold et al.

(10) Patent No.: US 10,148,227 B2
(45) Date of Patent: Dec. 4, 2018

(54) RF POWER AMPLIFIER DYNAMIC SUPPLY BOOSTING CIRCUIT

(71) Applicant: Qorvo US, Inc., Greensboro, NC (US)

(72) Inventors: Dirk Robert Walter Leipold, San Jose, CA (US); Baker Scott, San Jose, CA (US); George Maxim, Saratoga, CA (US); David Reed, Colorado Springs, CO (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/490,969

(22) Filed: Apr. 19, 2017

(65) Prior Publication Data

US 2018/0241350 A1    Aug. 23, 2018

Related U.S. Application Data

(60) Provisional application No. 62/460,157, filed on Feb. 17, 2017.

(51) Int. Cl.
    *H03F 1/02*      (2006.01)
    *H03F 3/19*      (2006.01)
    *H03F 3/21*      (2006.01)

(52) U.S. Cl.
    CPC ............. *H03F 1/0216* (2013.01); *H03F 3/19* (2013.01); *H03F 3/21* (2013.01); *H03F 2200/102* (2013.01); *H03F 2200/222* (2013.01); *H03F 2200/387* (2013.01); *H03F 2200/451* (2013.01)

(58) Field of Classification Search
    USPC ....... 330/296–297, 136, 310, 127, 129, 134, 330/279
    See application file for complete search history.

(56) References Cited

U.S. PATENT DOCUMENTS

| | | | |
|---|---|---|---|
| 6,985,039 B2 * | 1/2006 | Bar-David | H03F 1/0222 330/135 |
| 7,193,470 B2 * | 3/2007 | Lee | H03F 1/0222 330/136 |
| 8,064,852 B2 | 11/2011 | Pennec | |
| 8,159,309 B1 | 4/2012 | Khlat et al. | |
| 8,866,547 B2 * | 10/2014 | Mathe | H03F 3/19 330/127 |

OTHER PUBLICATIONS

Khan, Leonard R., "Single-Sideband Transmission by Envelope Elimination and Restoration," Proceedings of the I. R.E., vol. 40, Issue 7, Jul. 1952, IEEE, pp. 803-806.

(Continued)

*Primary Examiner* — Hieu Nguyen
(74) *Attorney, Agent, or Firm* — Withrow & Terranova, P.L.L.C.

(57) ABSTRACT

Circuitry that includes a radio frequency (RF) power amplifier (PA) and a dynamic supply boosting circuit, is disclosed. The RF PA receives and amplifies an RF input signal to provide an RF transmit signal using a PA power supply voltage. The dynamic supply boosting circuit provides the PA power supply voltage using a dynamic supply input voltage, wherein when a peak-to-average (PAR) of the RF input signal exceeds a PAR threshold, the dynamic supply boosting circuit boosts the PA power supply voltage, such that the PA power supply voltage is greater than the dynamic supply input voltage.

20 Claims, 8 Drawing Sheets

(56) References Cited

OTHER PUBLICATIONS

Wimpenny, Gerard, "Improving multi-carrier PA efficiency using envelope tracking," EE Times, Designing How-To, Mar. 2, 2008, http://www.eetimes.com/document.asp?doc_id=1276336, AspenCore, 7 pages.
Notice of Allowance for U.S. Appl. No. 12/822,848, dated Dec. 19, 2011, 7 pages.

* cited by examiner

RF POWER AMPLIFIER DYNAMIC SUPPLY BOOSTING CIRCUIT

RELATED APPLICATIONS

This application claims the benefit of U.S. Provisional Patent Application Ser. No. 62/460,157, filed Feb. 17, 2017, the disclosure of which is incorporated herein by reference in its entirety.

FIELD OF THE DISCLOSURE

Embodiments of the present disclosure relate to switching power supplies and radio frequency (RF) power amplifiers, both of which may be used in RF communication systems.

BACKGROUND

As wireless communications technologies evolve, wireless communications systems become increasingly sophisticated. As such, wireless communications protocols continue to expand and change to take advantage of the technological evolution. As a result, to maximize flexibility, many wireless communications devices must be capable of supporting any number of wireless communications protocols, each of which may have certain performance requirements, such as specific out-of-band emissions requirements, linearity requirements, or the like. As a result, certain wireless communications protocols may utilize very high peak power levels that may require high voltages for transmission. However, portable wireless communications devices are typically battery powered and need to be relatively small, have low cost, and have long battery life. As such, to minimize size, cost, and power consumption and to maximize battery life, RF circuitry in such a device needs to be as simple, small, and efficient as is practical. Thus, there is a need for RF circuitry in a communications device that is low cost, small, simple, and efficient, and that meets performance requirements.

SUMMARY

Circuitry, which includes a radio frequency (RF) power amplifier (PA) and a dynamic supply boosting circuit, is disclosed according to one embodiment of the present disclosure. The RF PA receives and amplifies an RF input signal to provide an RF transmit signal using a PA power supply voltage. The dynamic supply boosting circuit provides the PA power supply voltage using a dynamic supply input voltage, wherein when a peak-to-average ratio (PAR) of the RF input signal exceeds a PAR threshold, the dynamic supply boosting circuit boosts the PA power supply voltage, such that the PA power supply voltage is greater than the dynamic supply input voltage.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

Figure 1:
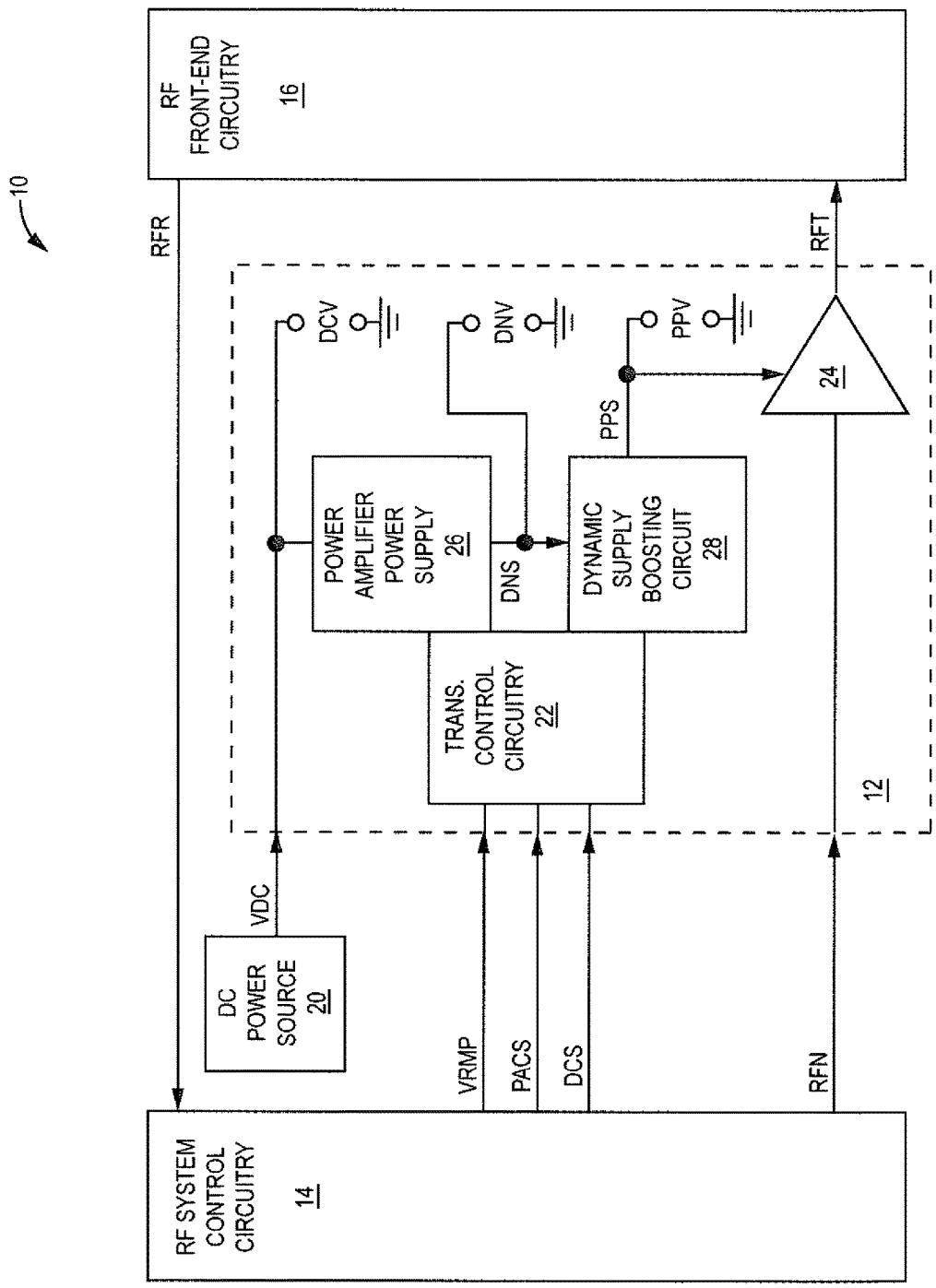
FIG. 1 shows a radio frequency (RF) communications system according to one embodiment of the RF communications system.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Radio frequency (RF) circuitry, which includes an RF power amplifier (PA) and a dynamic supply boosting circuit, is disclosed according to one embodiment of the present disclosure. The RF PA receives and amplifies an RF input signal to provide an RF transmit signal using a PA power supply voltage. The dynamic supply boosting circuit provides the PA power supply voltage using a dynamic supply input voltage, wherein when a peak-to-average ratio (PAR) of the RF input signal exceeds a PAR threshold, the dynamic supply boosting circuit boosts the PA power supply voltage, such that the PA power supply voltage is greater than the dynamic supply input voltage.

By boosting the PA power supply voltage, efficiency of the RF circuitry may be increased while meeting stringent wireless communications protocol requirements of wireless communications protocols that utilize very high peak power levels.

FIG. 1 shows an RF communications system 10 according to one embodiment of the RF communications system 10. The RF communications system 10 includes RF transmitter circuitry 12, RF system control circuitry 14, RF front-end circuitry 16, an RF antenna 18, and a DC power source 20. The RF transmitter circuitry 12 includes transmitter control circuitry 22, an RF PA 24, a PA power supply 26, and a dynamic supply boosting circuit 28.

In one embodiment of the RF communications system 10, the RF front-end circuitry 16 receives via the RF antenna 18, processes, and forwards an RF receive signal RFR to the RF system control circuitry 14. The RF system control circuitry 14 provides a power supply control signal VRMP, a transmitter configuration signal PACS, and a dynamic supply control signal DCS to the transmitter control circuitry 22. Further, the RF system control circuitry 14 provides an RF input signal RFN to the RF PA 24. The DC power source 20 provides a DC source signal VDC to the PA power supply 26. In one embodiment of the DC power source 20, the DC power source 20 is a battery. The DC source signal VDC has a DC source voltage DCV.

The transmitter control circuitry 22 is coupled to the PA power supply 26 and to the dynamic supply boosting circuit 28. The PA power supply 26 provides a dynamic supply input signal DNS to the dynamic supply boosting circuit 28 based on the power supply control signal VRMP. The dynamic supply input signal DNS has a dynamic supply input voltage DNV. The DC source signal VDC provides power to the PA power supply 26. As such, the dynamic supply input signal DNS is based on the DC source signal VDC. The power supply control signal VRMP is representative of a setpoint of the dynamic supply input signal DNS. In this regard, in one embodiment of the PA power supply 26, the PA power supply 26 regulates the dynamic supply input signal DNS based on the setpoint of the dynamic supply input signal DNS.

The dynamic supply boosting circuit 28 provides a PA power supply signal PPS to the RF PA 24 based on the dynamic supply input signal DNS and the dynamic supply control signal DCS. The PA power supply signal PPS has a PA power supply voltage PPV. In this regard, in one embodiment of the dynamic supply boosting circuit 28, the dynamic supply boosting circuit 28 provides the PA power supply voltage PPV using the dynamic supply input voltage DNV.

In one embodiment of the dynamic supply boosting circuit 28, the dynamic supply control signal DCS is representative of a peak-to-average ratio (PAR) of the RF input signal RFN. In one embodiment of the dynamic supply boosting circuit 28, when the PAR of the RF input signal RFN is less than a PAR threshold, the PA power supply voltage PPV is less than the dynamic supply input voltage DNV. However, when the PAR of the RF input signal RFN exceeds the PAR threshold, the dynamic supply boosting circuit 28 boosts the PA power supply voltage PPV, such that the PA power supply voltage PPV is greater than the dynamic supply input voltage DNV. In one embodiment of the dynamic supply boosting circuit 28, the dynamic supply boosting circuit 28 boosts the PA power supply voltage PPV based on the dynamic supply control signal DCS.

In one embodiment of the dynamic supply boosting circuit 28, the dynamic supply boosting circuit 28 boosts the PA power supply voltage PPV for less than a maximum boost duration of the dynamic supply boosting circuit 28. In one embodiment of the dynamic supply boosting circuit 28, when the PAR drops below the PAR threshold, the dynamic supply boosting circuit 28 stops boosting the PA power supply voltage PPV.

The RF PA 24 receives and amplifies the RF input signal RFN to provide an RF transmit signal RFT using the PA power supply voltage PPV. The PA power supply voltage PPV provides power for amplification. In one embodiment of the PA power supply 26, the PA power supply 26 amplitude modulates the dynamic supply input voltage DNV, such that the PA power supply voltage PPV at least partially tracks an envelope of the RF transmit signal RFT, thereby providing envelope tracking.

In an alternate embodiment of the PA power supply 26, the PA power supply 26 provides a constant magnitude of the dynamic supply input voltage DNV, such that the PA power supply voltage PPV maintains a constant magnitude based on the constant magnitude of the dynamic supply input voltage DNV. By changing the constant magnitude of the dynamic supply input voltage DNV, the PA power supply voltage PPV may at least partially track an average power of the RF transmit signal RFT, thereby providing average power tracking of the envelope of the RF transmit signal RFT.

The RF front-end circuitry 16 receives, processes, and transmits the RF transmit signal RFT via the RF antenna 18. In one embodiment of the RF transmitter circuitry 12, the transmitter control circuitry 22 configures the RF transmitter circuitry 12 based on the transmitter configuration signal PACS.

In one embodiment of the RF front-end circuitry 16, the RF front-end circuitry 16 includes at least one RF switch, at least one RF amplifier, at least one RF filter, at least one RF duplexer, at least one RF diplexer, at least one RF amplifier, the like, or any combination thereof. In one embodiment of the RF system control circuitry 14, the RF system control circuitry 14 is RF transceiver circuitry, which may include an RF transceiver integrated circuit, baseband controller circuitry, the like, or any combination thereof. In one embodiment of the RF transmitter circuitry 12, the RF PA 24 receives and amplifies the RF input signal RFN to provide the RF transmit signal RFT to the RF front-end circuitry 16 using the envelope PA power supply signal PPS.

Figure 2:
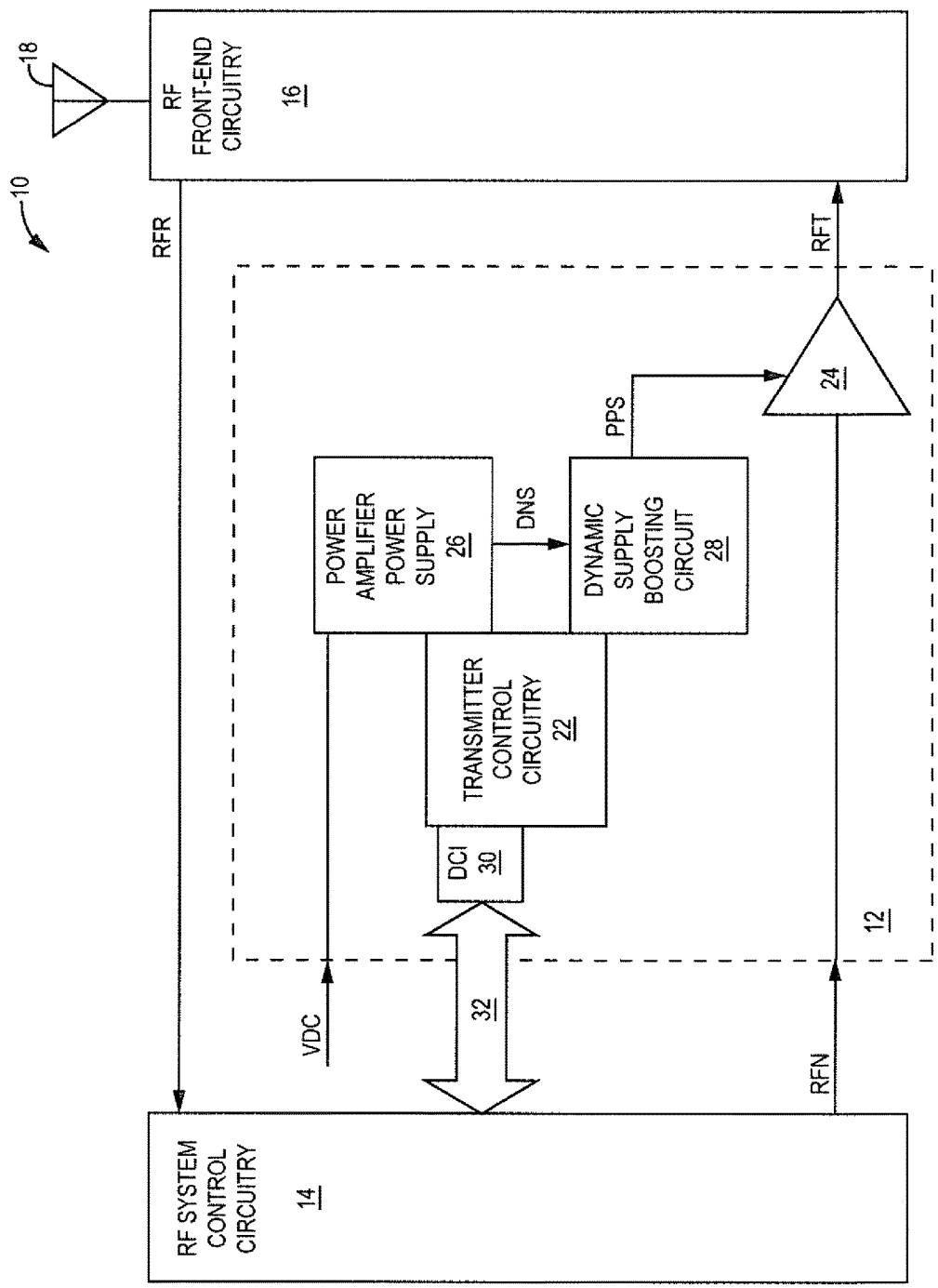
FIG. 2 shows the RF communications system according to an alternate embodiment of the RF communications system.

FIG. 2 shows the RF communications system 10 according to an alternate embodiment of the RF communications system 10. The RF communications system 10 illustrated in FIG. 2 is similar to the RF communications system 10 illustrated in FIG. 1, except that in the RF communications system 10 illustrated in FIG. 2, the RF transmitter circuitry 12 further includes a digital communications interface 30, which is coupled between the transmitter control circuitry 22 and a digital communications bus 32. The digital communications bus 32 is also coupled to the RF system control circuitry 14. As such, the RF system control circuitry 14 provides the envelope power supply control signal VRMP (FIG. 1), the transmitter configuration signal PACS (FIG. 1), and the dynamic supply control signal DCS (FIG. 1) to the transmitter control circuitry 22 via the digital communications bus 32 and the digital communications interface 30.

Figure 3:
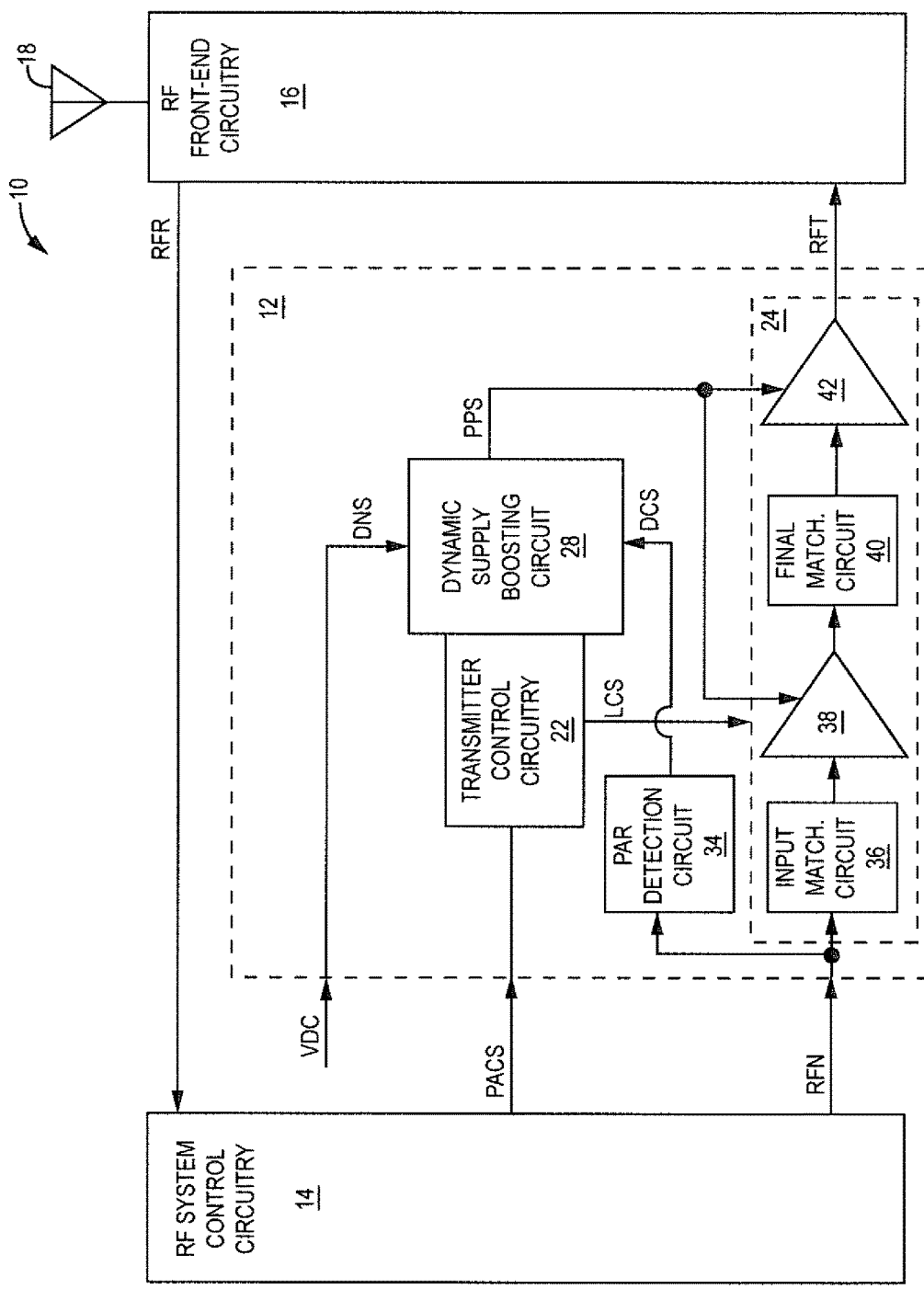
FIG. 3 shows the RF communications system according to an additional embodiment of the RF communications system.

FIG. 3 shows the RF communications system 10 according to an additional embodiment of the RF communications system 10. The RF communications system 10 illustrated in FIG. 3 is similar to the RF communications system 10 illustrated in FIG. 1, except that in the RF communications system 10 illustrated in FIG. 3, the PA power supply 26 is omitted, the RF system control circuitry 14 does not provide the dynamic supply control signal DCS and the envelope power supply control signal VRMP, the RF transmitter circuitry 12 further includes a PAR detection circuit 34, details of the RF PA 24 are shown, and the RF system control circuitry 14 provides a delay control signal LCS to the RF PA 24 via the transmitter control circuitry 22 using the transmitter configuration signal PACS.

The PAR detection circuit 34 receives the RF input signal RFN, detects the PAR of the RF input signal RFN, and provides the dynamic supply control signal DCS to the dynamic supply boosting circuit 28 based on the PAR of the RF input signal RFN. As such, in one embodiment of the PAR detection circuit 34, the PAR detection circuit 34 detects when the PAR of the RF input signal RFN exceeds the PAR threshold.

The DC power source 20 (FIG. 1) provides the dynamic supply input signal DNS to the dynamic supply boosting circuit 28, such that the DC power source 20 (FIG. 1) provides the dynamic supply input voltage DNV (FIG. 1) to the dynamic supply boosting circuit 28. As such, the RF communications system 10 illustrated in FIG. 3 does not support envelope tracking or average power tracking.

In one embodiment of the RF system control circuitry 14, the RF system control circuitry 14 adjusts a delay in the RF PA 24 using the delay control signal LCS. As such, in one embodiment of the RF system control circuitry 14, the RF system control circuitry 14 adjusts the delay in the RF PA 24 based on when the PAR of the RF input signal RFN exceeds the PAR threshold.

In one embodiment of the RF PA 24, the RF PA 24 includes an input impedance matching circuit 36, a driver stage 38, a final stage impedance matching circuit 40, and a final stage 42 coupled in series between the RF system control circuitry 14 and the RF front-end circuitry 16. As such, the driver stage 38 and the final stage 42 amplify the RF input signal RFN to provide the RF transmit signal RFT, such that each of the driver stage 38 and the final stage 42 uses the PA power supply voltage PPV (FIG. 1) for amplification.

A delay through at least one of the input impedance matching circuit 36 and the final stage impedance matching circuit 40 is based on the delay control signal LCS. In one embodiment of the input impedance matching circuit 36, the input impedance matching circuit 36 provides at least a partial impedance match between the RF system control circuitry 14 and the driver stage 38. In one embodiment of the final stage impedance matching circuit 40, the final stage impedance matching circuit 40 provides at least a partial impedance match between the driver stage 38 and the final stage 42.

Figure 4:
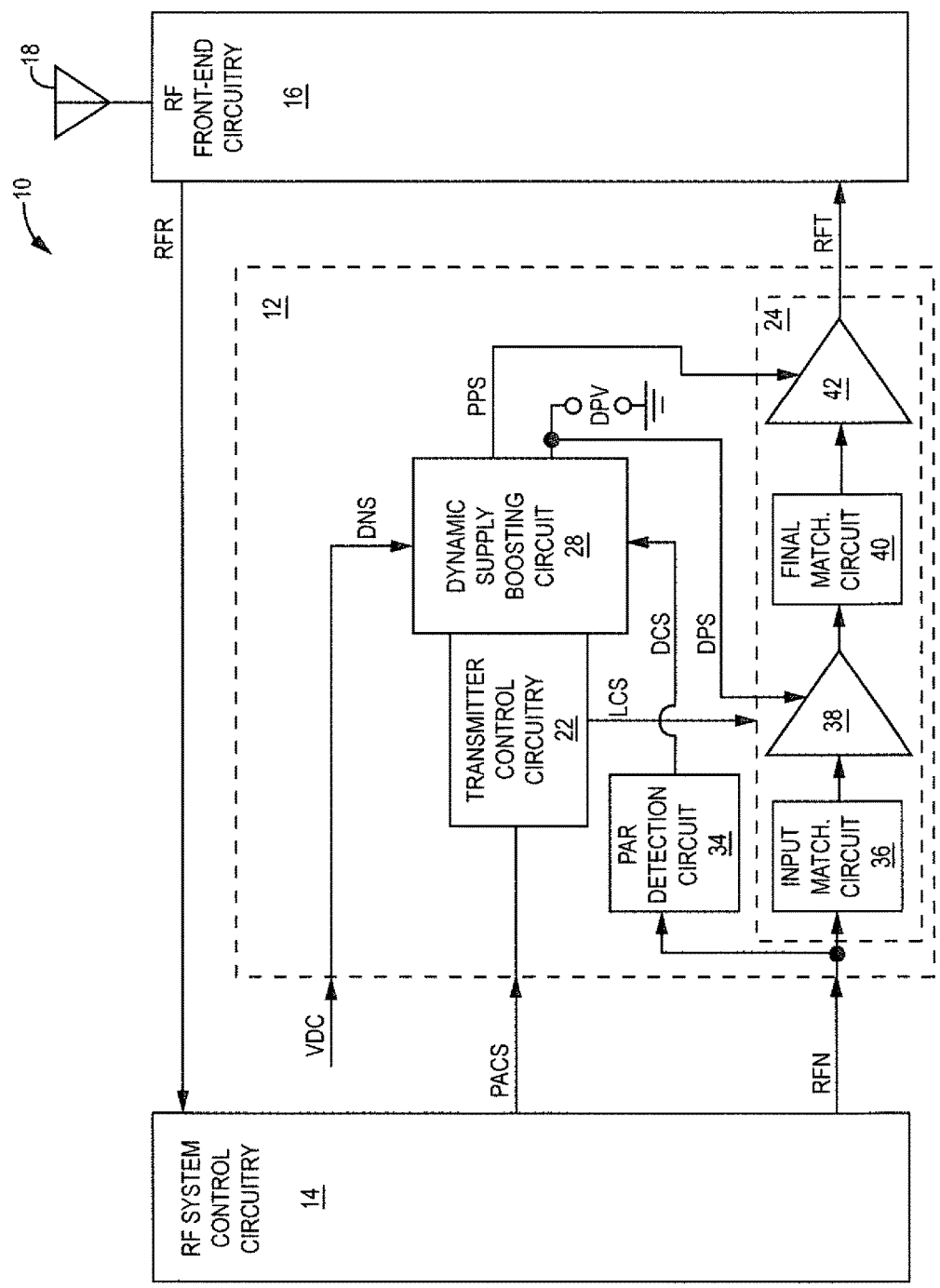
FIG. 4 shows the RF communications system according to another embodiment of the RF communications system.

FIG. 4 shows the RF communications system 10 according to another embodiment of the RF communications system 10. The RF communications system 10 illustrated in FIG. 4 is similar to the RF communications system 10 illustrated in FIG. 3, except in the RF communications system 10 illustrated in FIG. 4, the dynamic supply boosting circuit 28 provides the PA power supply signal PPS and a PA driver supply signal DPS to the RF PA 24. The PA driver supply signal DPS has a PA driver supply voltage DPV. As such, the dynamic supply boosting circuit 28 provides the PA power supply voltage PPV (FIG. 1) and the PA driver supply voltage DPV using the dynamic supply input voltage DNV (FIG. 1).

In this regard, the driver stage 38 uses the PA driver supply voltage DPV for amplification and the final stage 42 uses the PA power supply voltage PPV (FIG. 1) for amplification. As such, the RF PA 24 receives and amplifies the RF input signal RFN to provide the RF transmit signal RFT using the PA power supply voltage PPV (FIG. 1) and the PA driver supply voltage DPV.

Further, when the PAR of the RF input signal RFN exceeds the PAR threshold, the dynamic supply boosting circuit 28 boosts the PA power supply voltage PPV (FIG. 1) and the PA driver supply voltage DPV, such that each of the PA power supply voltage PPV (FIG. 1) and the PA driver supply voltage DPV is greater than the dynamic supply input voltage DNV (FIG. 1).

Figure 5A:
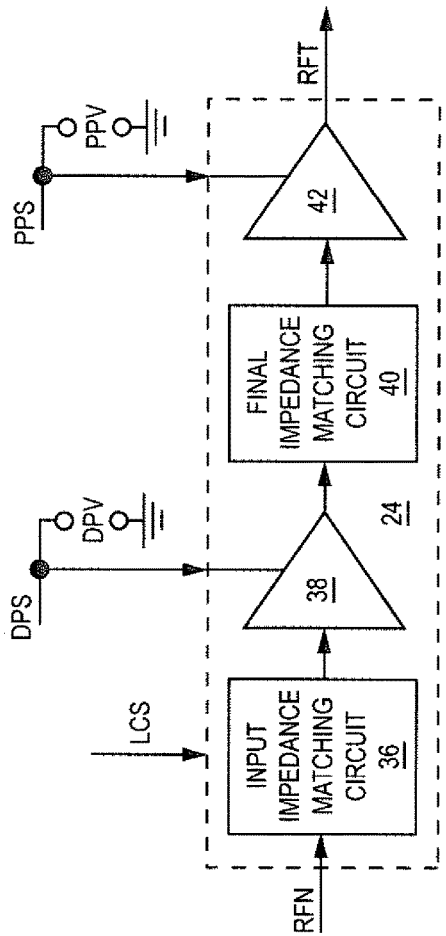
FIG. 5A shows details of the RF power amplifier (PA) illustrated in FIG. 4 according to one embodiment of the RF PA.
Figure 5B:
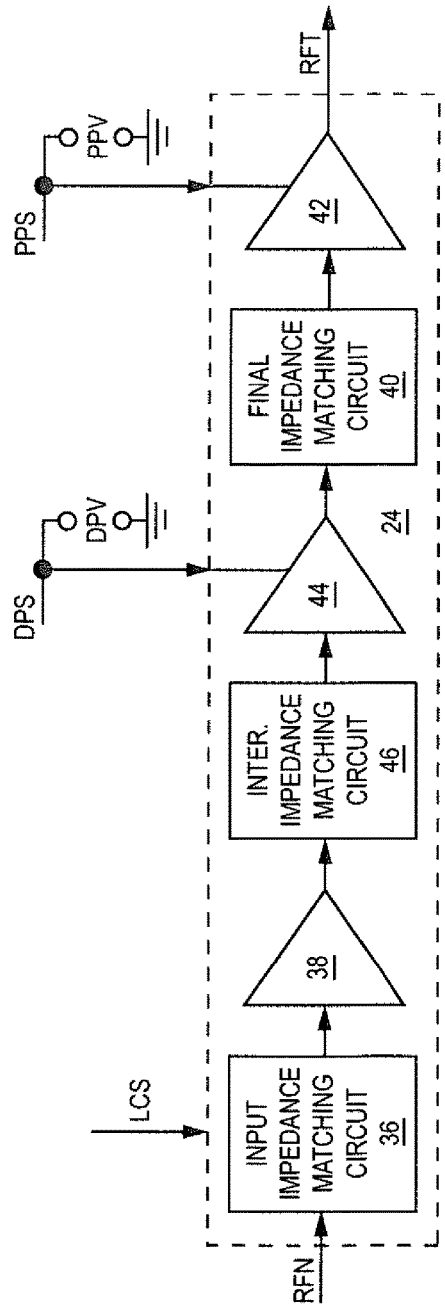
FIG. 5B shows details the RF PA illustrated in FIG. 4 according to an alternate embodiment of the RF PA.

FIG. 5A shows details of the RF PA 24 illustrated in FIG. 4 according to one embodiment of the RF PA 24. The RF PA 24 illustrated in FIG. 5A is similar to the RF PA 24 illustrated in FIG. 4. FIG. 5B shows details the RF PA 24 illustrated in FIG. 4 according to an alternate embodiment of the RF PA 24. The RF PA 24 illustrated in FIG. 5B is similar to the RF PA 24 illustrated in FIG. 5A, except the RF PA 24 illustrated in FIG. 5B further includes an intermediate stage 44 and an intermediate stage impedance matching circuit 46 coupled in series between the driver stage 38 and the final stage impedance matching circuit 40.

In one embodiment of the RF PA 24, the RF PA 24 includes the input impedance matching circuit 36, the driver stage 38, the intermediate stage impedance matching circuit 46, the intermediate stage 44, the final stage impedance matching circuit 40, and the final stage 42 coupled in series between the RF system control circuitry 14 (FIG. 4) and the RF front-end circuitry 16 (FIG. 4). As such, the driver stage 38, the intermediate stage 44, and the final stage 42 amplify the RF input signal RFN to provide the RF transmit signal RFT, such that the intermediate stage 44 uses the PA driver supply voltage DPV for amplification and the final stage 42 uses the PA power supply voltage PPV for amplification.

In one embodiment of the RF PA 24, a delay through at least one of the input impedance matching circuit 36, the intermediate stage impedance matching circuit 46, and the final stage impedance matching circuit 40 is based on the delay control signal LCS. In one embodiment of the input impedance matching circuit 36, the input impedance matching circuit 36 provides at least a partial impedance match between the RF system control circuitry 14 (FIG. 4) and the driver stage 38. In one embodiment of the intermediate stage impedance matching circuit 46, the intermediate stage impedance matching circuit 46 provides at least a partial impedance match between the driver stage 38 and the intermediate stage 44. In one embodiment of the final stage impedance matching circuit 40, the final stage impedance matching circuit 40 provides at least a partial impedance match between the intermediate stage 44 and the final stage 42.

Figure 6A:
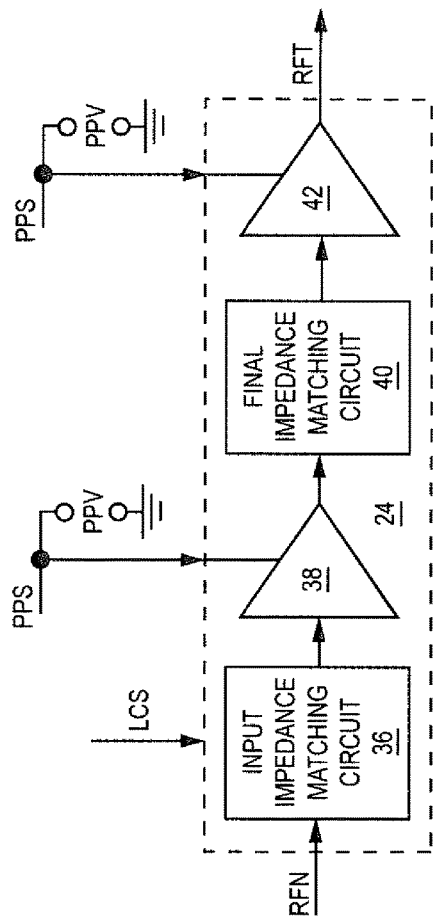
FIG. 6A shows details of the RF PA illustrated in FIG. 3 according to one embodiment of the RF PA.

FIG. 6A shows details of the RF PA 24 illustrated in FIG. 3 according to one embodiment of the RF PA 24. The RF PA 24 illustrated in FIG. 6A is similar to the RF PA 24 illustrated in FIG. 5A, except the driver stage 38 illustrated in FIG. 6A uses the PA power supply voltage PPV for amplification.

Figure 6B:
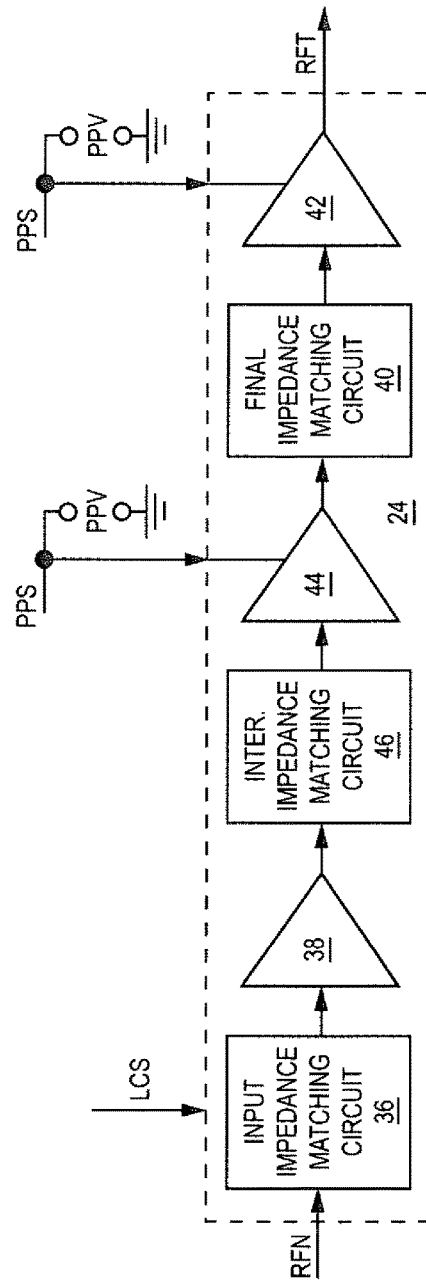
FIG. 6B shows details of the RF PA illustrated in FIG. 3 according to an alternate embodiment of the RF PA.

FIG. 6B shows details of the RF PA 24 illustrated in FIG. 3 according to an alternate embodiment of the RF PA 24. The RF PA 24 illustrated in FIG. 6B is similar to the RF PA 24 illustrated in FIG. 5B, except the intermediate stage 44 illustrated in FIG. 6B uses the PA power supply voltage PPV for amplification.

Figure 7A:
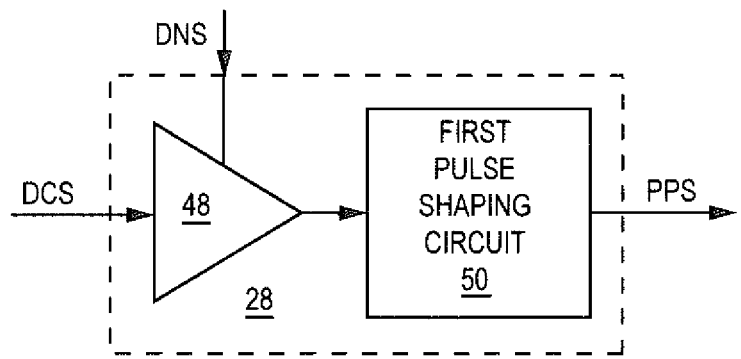
FIG. 7A shows details of the dynamic supply boosting circuit illustrated in FIG. 3 according to one embodiment of the dynamic supply boosting circuit.

FIG. 7A shows details of the dynamic supply boosting circuit 28 illustrated in FIG. 3 according to one embodiment of the dynamic supply boosting circuit 28. The dynamic supply boosting circuit 28 includes a pulse generating circuit 48 and a first pulse shaping circuit 50. The pulse generating circuit 48 receives the dynamic supply input signal DNS and the dynamic supply control signal DCS. The pulse generating circuit 48 is powered via the dynamic supply input signal DNS. The pulse generating circuit 48 provides a pulse to the first pulse shaping circuit 50 when the PAR of the RF input signal RFN (FIG. 3) exceeds the PAR of the RF input signal RFN (FIG. 3) as indicated by the dynamic supply control signal DCS. The first pulse shaping circuit 50 boosts the PA power supply voltage PPV (FIG. 1) when the pulse generating circuit 48 provides the pulse to the first pulse shaping circuit 50.

Figure 7B:
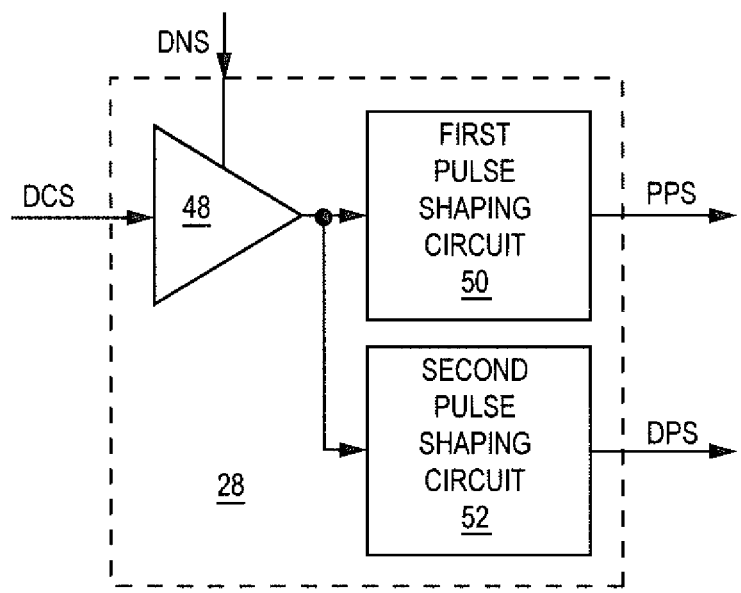
FIG. 7B shows details of the dynamic supply boosting circuit illustrated in FIG. 4 according to an alternate embodiment of the dynamic supply boosting circuit.

FIG. 7B shows details of the dynamic supply boosting circuit 28 illustrated in FIG. 4 according to an alternate embodiment of the dynamic supply boosting circuit 28. The dynamic supply boosting circuit 28 includes the pulse generating circuit 48, the first pulse shaping circuit 50, and a second pulse shaping circuit 52. The pulse generating circuit 48 receives the dynamic supply input signal DNS and the dynamic supply control signal DCS. The pulse generating circuit 48 is powered via the dynamic supply input signal DNS. The pulse generating circuit 48 provides a pulse to the first pulse shaping circuit 50 and the second pulse shaping circuit 52 when the PAR of the RF input signal RFN (FIG. 4) exceeds the PAR of the RF input signal RFN (FIG. 4) as indicated by the dynamic supply control signal DCS. The first pulse shaping circuit 50 boosts the PA power supply voltage PPV (FIG. 1) when the pulse generating circuit 48 provides the pulse to the first pulse shaping circuit 50. The second pulse shaping circuit 52 boosts the PA driver supply voltage DPV (FIG. 4) when the pulse generating circuit 48 provides the pulse to the second pulse shaping circuit 52.

Figure 8:
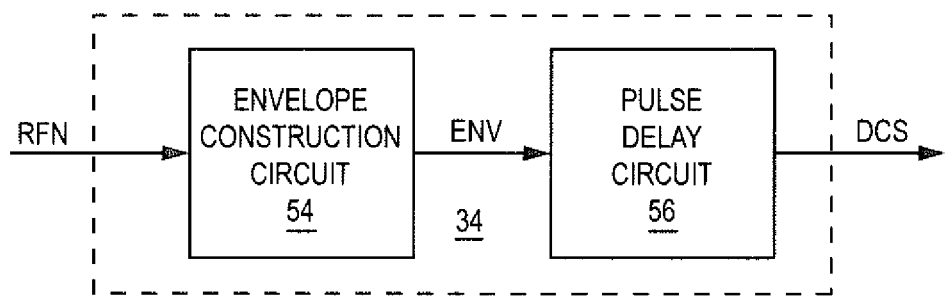
FIG. 8 shows details of a peak-to-average ratio (PAR) detection circuit illustrated in FIG. 3 according to one embodiment of the PAR detection circuit.

FIG. 8 shows details of the PAR detection circuit 34 illustrated in FIG. 3 according to one embodiment of the PAR detection circuit 34. The PAR detection circuit 34 receives the RF input signal RFN, detects the PAR of the RF input signal RFN, and provides the dynamic supply control signal DCS to the dynamic supply boosting circuit 28 (FIG. 3) based on the PAR of the RF input signal RFN. As such, in one embodiment of the PAR detection circuit 34, the PAR detection circuit 34 detects when the PAR of the RF input signal RFN exceeds the PAR threshold.

The PAR detection circuit 34 includes an envelope construction circuit 54 and a pulse delay circuit 56. The envelope construction circuit 54 detects an envelope of the RF input signal RFN to provide an envelope signal ENV to the pulse delay circuit 56. The pulse delay circuit 56 delays the envelope signal ENV to provide the dynamic supply control signal DCS.

Those skilled in the art will recognize improvements and modifications to the embodiments of the present disclosure. All such improvements and modifications are considered within the scope of the concepts disclosed herein and the claims that follow.

What is claimed is:

1. Circuitry comprising:
    a radio frequency (RF) power amplifier (PA) configured to receive and amplify an RF input signal to provide an RF transmit signal using a PA power supply voltage; and
    a dynamic supply boosting circuit configured to:
        provide the PA power supply voltage using a dynamic supply input voltage; and
        when a peak-to-average ratio (PAR) of the RF input signal exceeds a PAR threshold, boost the PA power supply voltage, such that the PA power supply voltage is greater than the dynamic supply input voltage;
        wherein the dynamic supply boosting circuit comprises a pulse generating circuit and a first pulse shaping circuit, such that the pulse generating circuit is configured to provide a pulse to the first pulse shaping circuit when the PAR of the RF input signal exceeds the PAR threshold.

2. The circuitry of claim 1 wherein the dynamic supply boosting circuit is further configured to boost the PA power supply voltage for less than a maximum boost duration.

3. The circuitry of claim 1 wherein when the PAR is less than the PAR threshold, the PA power supply voltage is less than the dynamic supply input voltage.

4. The circuitry of claim 1 wherein the PA power supply voltage provides power for amplification.

5. The circuitry of claim 1 further comprising a PA power supply configured to provide and amplitude modulate the dynamic supply input voltage, wherein the PA power supply voltage at least partially tracks an envelope of the RF transmit signal, thereby providing envelope tracking.

6. The circuitry of claim 1 further comprising a PA power supply configured to provide a constant magnitude of the dynamic supply input voltage, wherein the PA power supply voltage provides average power tracking of an envelope of the RF transmit signal.

7. The circuitry of claim 1 wherein the dynamic supply boosting circuit is further configured to boost the PA power supply voltage based on a dynamic supply control signal, which is representative of the PAR of the RF input signal.

8. The circuitry of claim 7 wherein control circuitry is configured to provide the RF input signal and the dynamic supply control signal.

9. The circuitry of claim 7 further comprising a PAR detection circuit configured to receive the RF input signal, detect when the PAR of the RF input signal exceeds the PAR threshold, and provide the dynamic supply control signal.

10. The circuitry of claim 9 wherein the PAR detection circuit comprises an envelope construction circuit and a pulse delay circuit, such that the envelope construction circuit is configured to detect an envelope of the RF input signal to provide an envelope signal, and the pulse delay circuit is configured to delay the envelope signal to provide the dynamic supply control signal.

11. The circuitry of claim 7 wherein control circuitry is configured to adjust a delay in the RF PA using a delay control signal based on when the PAR of the RF input signal exceeds the PAR threshold.

12. The circuitry of claim 7 wherein the pulse generating circuit is configured to provide the pulse to the first pulse shaping circuit when the PAR of the RF input signal exceeds the PAR threshold as indicated by the dynamic supply control signal.

13. The circuitry of claim 1 wherein the first pulse shaping circuit is configured to boost the PA power supply voltage when the pulse generating circuit provides the pulse to the first pulse shaping circuit.

14. The circuitry of claim 7 wherein the dynamic supply boosting circuit further comprises a second pulse shaping circuit, such that the pulse generating circuit is configured to provide the pulse to the second pulse shaping circuit when the PAR of the RF input signal exceeds the PAR threshold as indicated by the dynamic supply control signal.

15. The circuitry of claim 14 wherein the first pulse shaping circuit is configured to boost the PA power supply voltage and the second pulse shaping circuit is configured to boost a PA driver supply voltage when the pulse generating circuit provides the pulse to the first pulse shaping circuit and the second pulse shaping circuit.

16. The circuitry of claim 1 wherein the RF PA comprises a driver stage and a final stage coupled in series and configured to amplify the RF input signal to provide the RF transmit signal, wherein each of the driver stage and the final stage uses the PA power supply voltage for amplification.

17. The circuitry of claim 1 wherein the RF PA comprises an input impedance matching circuit, a driver stage, a final stage impedance matching circuit, and a final stage, such that a delay through at least one of the input impedance matching circuit and the final stage impedance matching circuit is based on a delay control signal.

18. The circuitry of claim 1 wherein:
the RF PA is further configured to receive and amplify the RF input signal to provide the RF transmit signal using the PA power supply voltage and a PA driver supply voltage; and
the dynamic supply boosting circuit is further configured to:
provide the PA power supply voltage and the PA driver supply voltage using the dynamic supply input voltage; and
when the PAR of the RF input signal exceeds the PAR threshold, boost the PA power supply voltage and the PA driver supply voltage, such that each of the PA power supply voltage and the PA driver supply voltage is greater than the dynamic supply input voltage.

19. The circuitry of claim 1 wherein a DC power source is configured to provide the dynamic supply input voltage.

20. A method comprising:
receiving and amplifying a radio frequency (RF) input signal to provide an RF transmit signal using a power amplifier (PA) power supply voltage;
providing the PA power supply voltage using a dynamic supply input voltage; and
when a peak-to-average ratio (PAR) of the RF input signal exceeds a PAR threshold, boosting the PA power supply voltage, such that the PA power supply voltage is greater than the dynamic supply input voltage;
wherein boosting the PA power supply voltage comprises generating and shaping a pulse when the PAR of the RF input signal exceeds the PAR threshold.

* * * * *